United States Patent [19]
Kamp

[11] Patent Number: 5,995,407
[45] Date of Patent: Nov. 30, 1999

[54] SELF-REFERENCING FERROELECTRIC MEMORY

[75] Inventor: David A. Kamp, Monument, Colo.

[73] Assignee: Celis Semiconductor Corporation, Colorado Springs, Colo.

[21] Appl. No.: 09/170,418

[22] Filed: Oct. 13, 1998

[51] Int. Cl.[6] .................................................. G11C 11/22
[52] U.S. Cl. ........................ 365/145; 365/189.09; 365/65
[58] Field of Search ................................... 365/145, 117, 365/65, 189.09

[56] References Cited

U.S. PATENT DOCUMENTS

| | | | |
|---|---|---|---|
| 2,876,436 | 3/1959 | Anderson | 340/173 |
| 4,873,664 | 10/1989 | Eaton, Jr. | 365/145 |
| 4,888,733 | 12/1989 | Mobley | 365/145 |
| 5,029,128 | 7/1991 | Toda | 365/145 |
| 5,406,510 | 4/1995 | Mihara et al. | 365/145 |
| 5,598,366 | 1/1997 | Kraus et al. | 365/145 |

*Primary Examiner*—David Nelms
*Assistant Examiner*—David Lam
*Attorney, Agent, or Firm*—Duft, Graziano & Forest, P.C.

[57] ABSTRACT

A ferroelectric integrated circuit memory includes a memory cell having a ferroelectric capacitor, one electrode of which is connected to a bit line through a transistor and the other electrode of which is connected to a plate line. The plate line is floating at one-half Vcc when the bit line is lowered to zero volts to develop a read voltage on the plate line. A unity gain amplifier then drives a complementary plate line to the same voltage as the plate line, then the plate line and complementary plate line are connected via a transistor, and the bit line is raised to Vcc to develop a reference voltage. This operation subtracts the read voltage from the reference voltage to develop a net voltage on the complementary plate line. The voltage on the complementary plate line is applied to the output line, compared via a sense amplifier to a one-half Vcc voltage on the input line, and the sense amp then drives the input and output lines to zero and Vcc, depending on whether the developed voltage was greater or less than one-half Vcc.

19 Claims, 5 Drawing Sheets

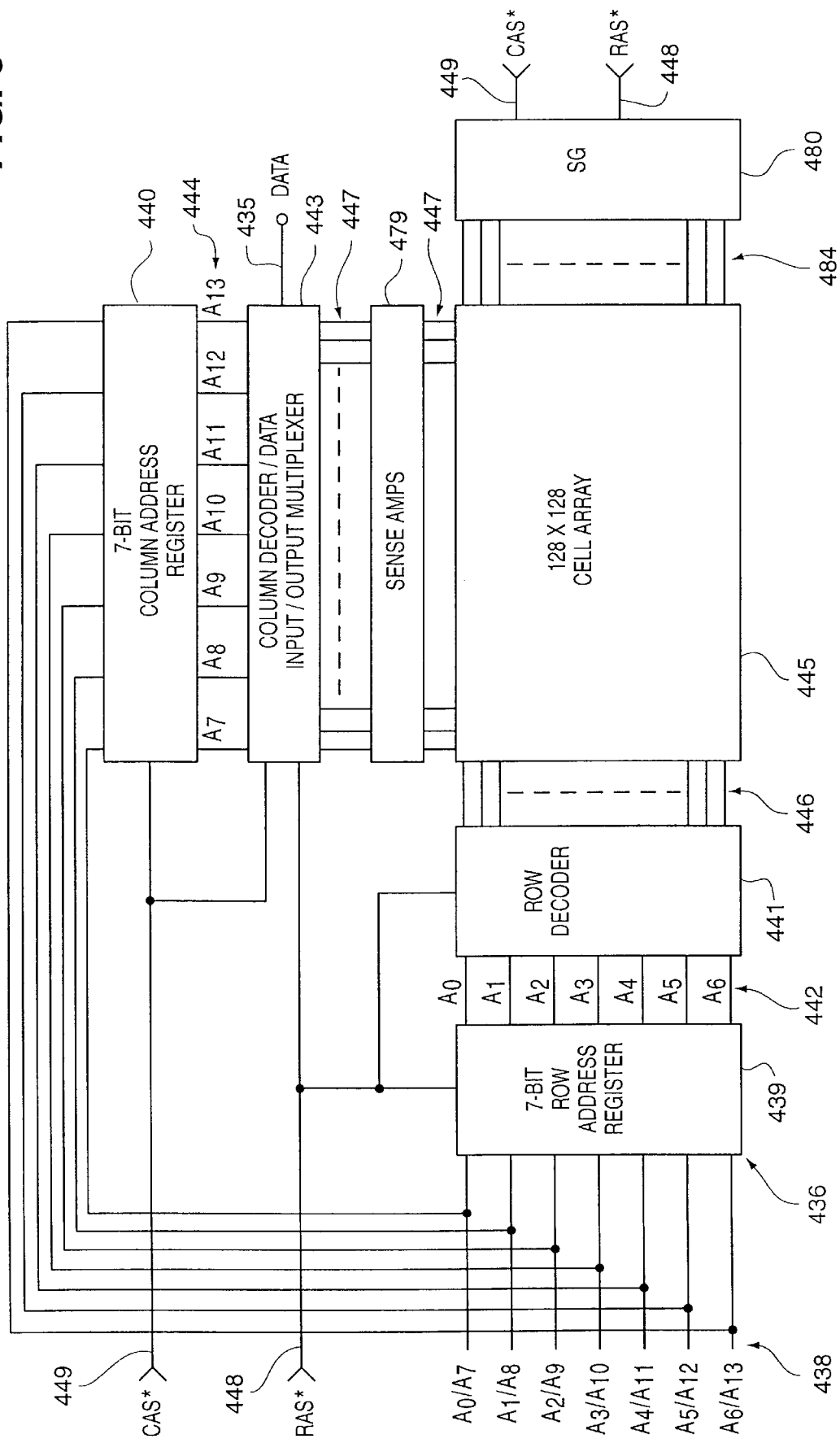

SELF-REFERENCING FERROELECTRIC MEMORY

BACKGROUND OF THE INVENTION

1. Field of the Invention

The invention in general relates to ferroelectric electronic memories and more particularly to such a memory in which the electronic signal output by the memory is independent of the history of the ferroelectric material.

2. Statement of the Problem

It is well-known that ferroelectric materials are capable of retaining a polarization which can be used to store information in a non-volatile memory. For example, if a strong enough electric field or voltage is placed across a ferroelectric capacitor, when the voltage is removed, a polarization in the direction of the field remains. If the field is then placed across the same capacitor in the opposite direction, the ferroelectric material switches, and when the field is removed, a polarization in the opposite direction remains. Electronic circuits have been designed to associate the polarization in one direction with a digital logic "1" state, and polarization in the opposite direction with a logic "0" state. See, for example, the circuits described in U.S. Pat. No. 2,876,436 issued to J. R. Anderson; U.S. Pat. No. 5,029,128 issued to Haruki Toda; and U.S. Pat. No. 5,406,510 issued to Takashi Mihara, et. al. These circuits include memory cells arranged in rows and columns, each memory cell including at least one switch and a capacitor having a pair of electrodes, and the memory also including plate lines connected to one electrode of the capacitor in each cell and bit lines connected to the other electrode of the capacitor through the switch. In the latter two patents the switch is a transistor having a gate and a pair of source/drains, and the memory further includes word lines connected to the control gate of the transistors. In the latter two patents, information is written into a memory cell by placing either a high or a low voltage on the bit line, turning the transistor on to connect the bit line to the capacitor, and placing a predetermined voltage between the high and low voltage on the plate line. The high voltage causes the memory cell to assume one polarization state, and the low voltage causes the memory cell to assume the opposite polarization state. The memory cell is read by creating a voltage difference between the bit line and plate line, connecting the bit line to the capacitor via the transistor. If the ferroelectric state changes due to the applied voltage, the bit line will assume a first voltage, and if the ferroelectric state does not switch, then the bit line will assume a second voltage. The bit line voltage is compared to a reference voltage that is about half-way between the first and second voltages; if the bit line voltage is below the reference voltage, a sense amp drives an output low, and if the bit line voltage is above the reference voltage, a sense amp drives an output high. In this way, the state of the ferroelectric capacitor prior to reading determines the output state when the cell is read.

Up until recently, all ferroelectric materials tended to fatigue over time, and the switching charge decreased to a point where the cell could no longer be read. Recently, a class of materials, called layered superlattice compounds herein, have been discovered that do not fatigue. However, while the switching charge remains relatively stable in these materials, there still remains a problem that the magnitude of the first and second voltages generally depends on the history of the memory cell. That is, depending on the history, both the first and second voltages in one reading on a specific cell will differ by voltage factor from the first and second voltages of a later reading of the same cell. For example, the hysteresis (polarization versus voltage) curve may drift over time in the order of milliseconds due to redistribution of charge within the capacitor. Thus, while the reference voltage will be between the first and second voltages for one reading, in a later reading both the first and second voltages may be above the reference voltage. This generally results in a misreading of the memory cell.

One solution to the above problem is disclosed in U.S. Pat. No. 4,888,733 issued to Kenneth J. Mobley on Dec. 19, 1989. The memory disclosed in the Mobley patent pulses the ferroelectric capacitor in one direction and stores the developed charge on a first temporary storage capacitor, pulses the ferroelectric capacitor in the opposite direction and stores the developed charge on a second temporary storage capacitor, and then compares the stored charges on the two storage capacitors. Thus, this memory is, in effect, self-referencing, since it does not require a separate reference potential. However, this solution significantly increases the length of time it takes to read a memory; thus, this memory is not competitive with state-of-the-art memories which require fast read times. Further, the memory cell layout is larger than that of other prior art memory cells, so a memory according to the Mobley design is relatively bulky and is not competitive in a memory market where memory chip are increasingly more dense. A ferroelectric memory that is self-referencing and also is competitive with state-of-the-art memories with respect to read time and density of the memory chip would be highly desirable.

3. Solution to the Problem

The present invention is a significant improvement over the prior art by providing a ferroelectric memory which develops a reference charge from which is subtracted the charge created on the plate line when the ferroelectric capacitor is read by placing a field across it. The following two benefits result: 1) a smaller memory cell; and 2) faster operation.

A second switching device in each memory cell is not required as in the Mobley cell since the voltage excursion of the plate line is not enough to significantly disturb deselected ferroelectric capacitors sharing that plate line. The result is a one-transistor-one-capacitor memory cell which lays out much smaller than the Mobley cell. A smaller memory cell, results in a smaller die size and reduced manufacturing cost.

The second major benefit of the invention is a streamlined read operation which reduces the time required for a read cycle. The Mobley invention requires the following sequence to develop a read charge:

1) the first bit line is driven from a low to a high and back to a low voltage;
2) the resulting signal on the second bit line is stored on a first capacitor and isolated from the second bit line;
3) the second bit line is driven from a low to a high and back to a low voltage; and
4) the resulting signal on the first bit line is stored on a second capacitor and isolated from the first bit line.

The present invention only requires one line being driven from a starting voltage level to a high, then low, and then back to the starting level. This produces the read signal minus the reference signal on the plate line.

The read voltage signal is generated from a read charge, which charge is shared between the capacitance of one plate line and the ferroelectric capacitance. The reference voltage signal is generated by fully switching the same ferroelectric capacitor. The resulting charge is shared between the capacitance of the two plate lines and the ferroelectric capacitance.

The invention provides a ferroelectric integrated circuit memory comprising: a memory cell comprising a ferroelectric memory element; a first conducting line electrically connected to or electrically connectable to the ferroelectric memory element; a second conductor connected to or electrically connectable to the ferroelectric memory element; a third conducting line; a line driver for driving the first conductor to place a first field across the ferroelectric element and a second field across the ferroelectric memory element, the first and second electric fields being in opposite directions; a unity gain amplifier for driving the third conductor to the same voltage as the second conductor; a switch for connecting the second conducting line and the third conducting line; and a signal generator for generating timing signals and applying the timing signals to the line driver, the unity gain amplifier and the switch in timed sequence. Preferably, the ferroelectric element is a ferroelectric capacitor. Preferably, the memory includes a bit line, a first plate line connected to one electrode of the capacitor, and a transistor between the bit line and the other electrode of the capacitor, the first conducting line comprises the bit line, and the second conducting line comprises the plate line. Preferably, the third conducting line comprises a second plate line complementary to the first plate line. Preferably, the memory includes a first bit line, a plate line connected to one electrode of the capacitor, and a transistor between the bit line and the other electrode of the capacitor, the first conducting line comprises the plate line, and the second conducting line comprises the first bit line. Preferably, the third conducting line comprises a second bit line complementary to the first bit line. The memory can have a folded architecture or an open architecture.

The invention also provides a method of reading a ferroelectric integrated circuit memory that includes a ferroelectric element, a first conducting line electrically connected or connectable to the ferroelectric element, a second conducting line electrically connected or connectable to the ferroelectric element, and a third conducting line, the method comprising the steps of: applying a first voltage to the first conducting line to develop a first corresponding voltage on the second conducting line; driving the third conducting line to a voltage essentially equal to the first corresponding voltage; connecting the second conducting line to the third conduting line; applying a second voltage the first conducting line to develop a second corresponding voltage on the second conducting line and the third conducting line; and sensing the second corresponding voltage to provide an output signal representative of the state of the ferroelectric element prior to the step of applying a first voltage. Preferably, the first voltage and the second voltage is less than one-half the supply voltage and the other of the first voltage and the second voltage is greater than the supply voltage. Preferably, the ferroelectric element is a capacitor, the step of applying a first voltage creates a first electric field across the capacitor, and the step of applying a second voltage creates a second electric field across the capacitor, the second electric field opposite in direction to the first electric field.

In another aspect, the invention provides a method of reading a ferroelectric integrated circuit memory, the memory including a ferroelectric element and the method comprising the steps of: applying a first electric field across the ferroelectric element to develop a first charge on a conducting line, the first charge including either: the switching charge developed when the ferroelectric element switches in response to the first electric field applied across the ferroelectric element, or the non-switching charge developed when the first electric field is placed across the ferroelectric element and the ferroelectric element does not switch; applying a second electric field across the ferroelectric element to develop a second charge on the conducting line, the second electric field essentially equal to and opposite in direction to the first electric field, and the second charge equal to essentially one-half the charge developed when the ferroelectric element switches from full polarization in one direction to full polarization in the opposite direction in response to the second electric field; permitting a voltage to develop on the line as a result of the first and second charges; and sensing the voltage with a sense amp to produce an output voltage indicative of the polarization state of the ferroelectric element prior to placing the first and second fields across the ferroelectric element. Preferably, the memory includes a third conducting line and the step of developing the second charge includes the step of connecting the first conducting line to the third conducting line. Preferably, the memory includes a third conducting line and the step of developing the second charge includes the step of developing a charge on the third conducting line that is essentially equal to the first charge.

In yet another aspect, the invention provides a method of reading a ferroelectric integrated circuit memory, the memory including a ferroelectric element capable of being in a first polarization state and a second polarization state, a conducting line electrically connected or connectable to the ferroelectric element, and a power supply providing a supply voltage of Vcc, the method comprising the steps of: applying a first electric field and a second electric field to the ferroelectric element to develop a voltage on the conducting line, the second electric field in a direction opposite to the first electric field, and the developed voltage being greater than one-half Vcc if the ferroelectric memory is in the first polarization state prior to the application of the first and second electric fields and the developed voltage being less than one-half Vcc if the ferroelectric element is in the second polarization state prior to the application of the first and second electric fields; and using a sense amplifier to compare the developed voltage with a voltage equal to one-half Vcc to produce an output voltage indicative of the state of the ferroelectric element prior to placing the first and second fields across the ferroelectric element. Preferably, the ferroelectric element is a capacitor, the memory includes a bit line and a plate line, and the conducting line comprises the plate line. Preferably, the ferroelectric element is a capacitor, the memory includes a bit line and a plate line, and the conducting line comprises the bit line.

In still another aspect the invention provides a method of reading a ferroelectric integrated circuit memory, the memory including a ferroelectric element capable of being in a first polarization state and a second polarization state, a conducting line electrically connected or connectable to the ferroelectric element, the method comprising the steps of: developing a voltage on the conducting line by applying a first electric field and a second electric field to the ferroelectric element, the second electric field in a direction opposite to the first electric field; and sensing the developed voltage with a sense amplifier to produce an output voltage indicative of the state of the ferroelectric element prior to placing the first and second fields across the ferroelectric element. Preferably, the step of developing comprises changing the capacitance of the conducting line between the application of the first electric field and the application of the second electric field. Preferably, the ferroelectric element is a capacitor, the memory includes a bit line and a plate line. and the conducting line comprises the plate line. Preferably the ferroelectric element is a capacitor, the memory includes a bit line and line, and the conducting line comprises the bit line.

The memory according to the invention not only is effective and reliable even when the ferroelectric polarizability drifts over time, but the memory is competitively dense and fast. Numerous otherfeatures, objects and advantages of the invention will become apparent from the following description when read in conjunction with the accompanying drawings.

BRIEF DESCRIPTION OF THE DRAWINGS

FIG. 6 shows an exemplary embodiment of a memory according to the invention that may utilize any of the memory arrays of FIGS. 1 and 6.

DESCRIPTION OF THE PREFERRED EMBODIMENT

1. Overview

Figure 1:
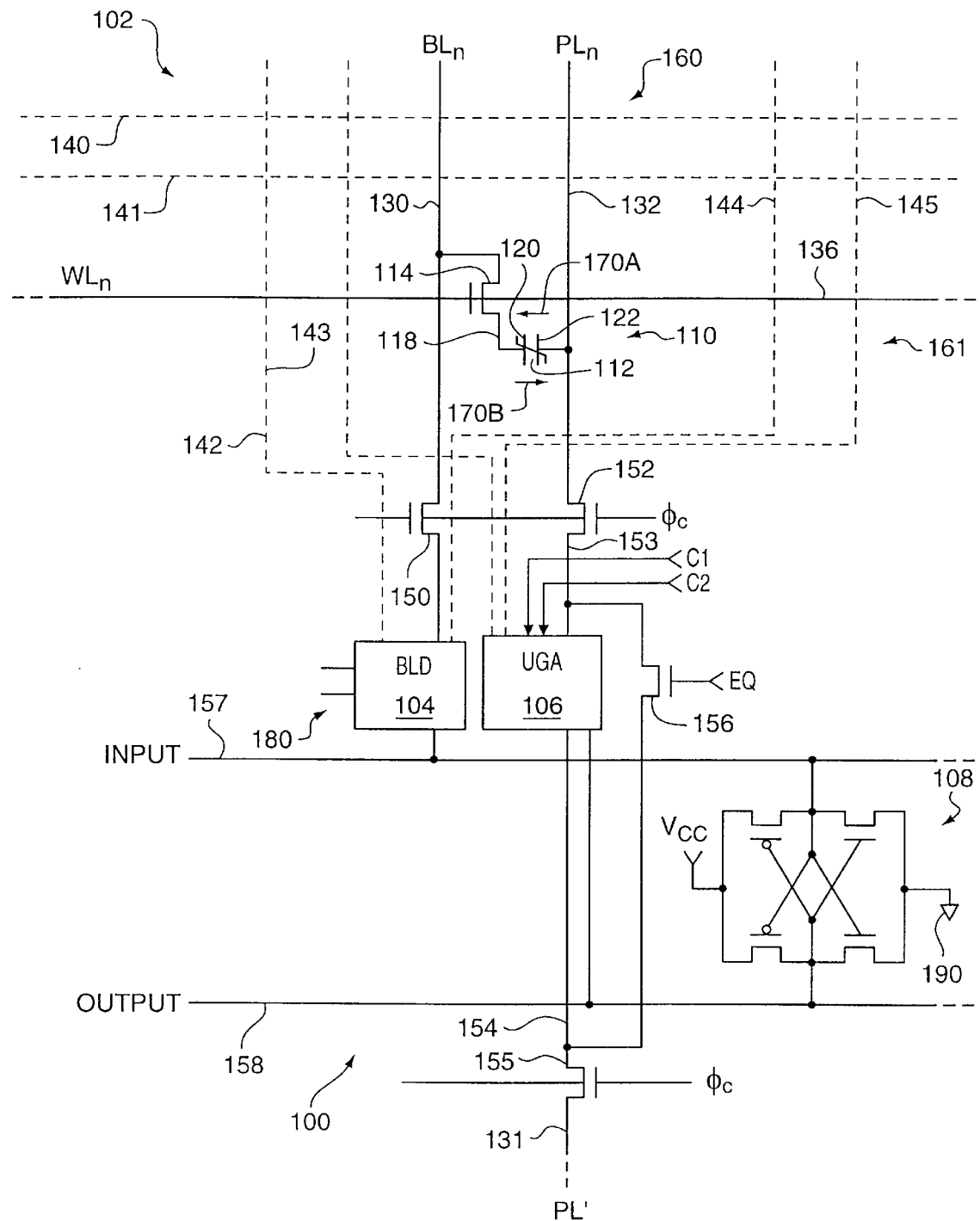
FIG. 1 is a schematic diagram of the preferred embodiment of a memory array according to the invention.

Directing attention to FIG. 1, a schematic diagram of a portion 100 of a memory according to the invention is shown. Memory portion 100 includes a memory array 102, a bit line driver circuit 104, a unity gain amplifier circuit 106, and a sense amplifier 108. Memory array 102 includes an array of rows and columns of memory cells, a typical one 110 of which is shown. The cell 110 comprises a ferroelectric capacitor 112 and transistor 114. One source/drain of transistor 114 is connected to one electrode 120 of capacitor 112 to form node 118. The other source/drain of transistor 114 is connected to a conductor 130, conventionally called a bit line 130. The other electrode 122 of capacitor 112 is connected to conductor 132, conventionally called a plate line 132. A conductor 136, conventionally called a word line 136, is connected to the gate of transistor 114. Bit line 130 is connected to bit line driver 104 through transistor 150, and plate line 132 is connected to the input/output 153 of unity gain amplifier 106 through transistor 152. The gates of transistors 150 and 152 are connected to a conductor carrying signal $\Phi_c$. A plate line 131 that is complementary to plate line 130 is also shown in FIG. 1. Complementary plate line 131 is connected to input/output 154 of unity gain amplifier 106 through transistor 155, the gate of which is also connected to the line carrying signal $\Phi_c$. Input/output 153 is connected to input/output 154 through transistor 156. A conductor carrying a signal Eq is connected to the gate of transistor 156. Bit line driver 104 is connected to input line 157. Unity gain amplifier circuit 106 has two additional inputs on which signal $C_1$ and $C_2$ are applied, and an output connected to output line 158. The input line 157 and output 158 are connected to sense amplifier 108, which also is connected to a voltage equal to the supply voltage Vcc, which is the "high" voltage or the sense amplifier. Sense amplifier 108 is also connected to the circuit ground 192 which is the "low" voltage of the sense amplifier. Sense amplifiers such as 108 are well-known in the art, and therefore its structure will not be discussed in detail.

The array 102 is made up of a number of rows of word lines and a number of columns of bit lines and plate lines. Only the nth word line is shown and the nth bit line and plate line pair. Other rows of cells and corresponding word lines are indicated generally by the horizontal dotted lines 140 and 141, while other columns of cells and corresponding bit line/plate line pairs are indicated by the dotted lines 142, 143, 144 and 145. A memory cell is located at the intersection of each of the dotted lines as well as at the intersection of the dotted lines with the bit line/plate line pair 130, 132. Each such memory cell is connected as shown for the typical cell 110. As indicated by the continuation of the dotted lines 142, 143, 144, and 145 to the bit line driver 104 and the unity gain amplifier 106, each bit line is connected to the bit line driver 104 through a transistor, such as 150, and each plate line is connected to the unity gain amplifier 106 through a transistor, such as 152. These transistors connect the bit line and plate line to the bit line driver 104 and unity gain amplifier 106 when the specific column of the bit line and plate line is addressed (see discussion in connection with FIG. 6, below). For example, when the nth column 160 is addressed, $\Phi_c$ goes high and transistors 150 turn on. When some other column is addressed, $\Phi_c$ as well as the corresponding signals for all columns except the addressed column are low, and the corresponding signal for the column addressed goes high, and the corresponding transistors for the addressed column turn on. This function of transistors 150 and 152 to connect electrical lines, such as a bit line, in an addressed column to an appropriate input or output is known in the art, and will not be discussed further herein.

The array 102 is an open bit line array. Thus, as known in the art, it also includes a portion below the input line 157 and output line 158 that is complementary to the portion above the lines 157 and 158. So as not to make FIG. 1 unnecessarily large and complex, only the plate line 131 that is complementary to plate line 130 is shown. The rest of the array is not required to fully explain the invention, so it is not shown. In an alternative embodiment, the complementary plate line 131 is a plate line in the upper array, as in a folded bit line architecture.

In the preferred embodiment, there is one bit line driver 104 and one unity gain amplifier 106 for every eight bit lines. However, the invention contemplates that, in some embodiments, a single bit line driver drives all the bit lines, and a single unity gain amplifier can serve all the plate lines, or an embodiment may include a bit line driver 104 for each bit line and unity gain amplifier 106 for each plate line. In the latter embodiment, transistors 150 and 152 would not be present. Embodiments all along the range between the two foregoing extremes are also contemplated.

As known in the art, a signal on a word line selects the row to be addressed. In particular, the signal on word line 136 determines if row 161 is to be addressed, and selects cell 110 by turning on transistor 114 when row 161 is addressed. If at the same time column 160 is addressed, then cell 110 is the memory cell selected to be either read or written to. When column 160 is addressed, a signal is applied to bit line 130 via bit line driver 104 to read or write to the memory cell 110. The application of a read signal to bit line 104 causes a signal to develop on the plate line 132, which signal is processed to provide output data on line 158.

Figure 3:
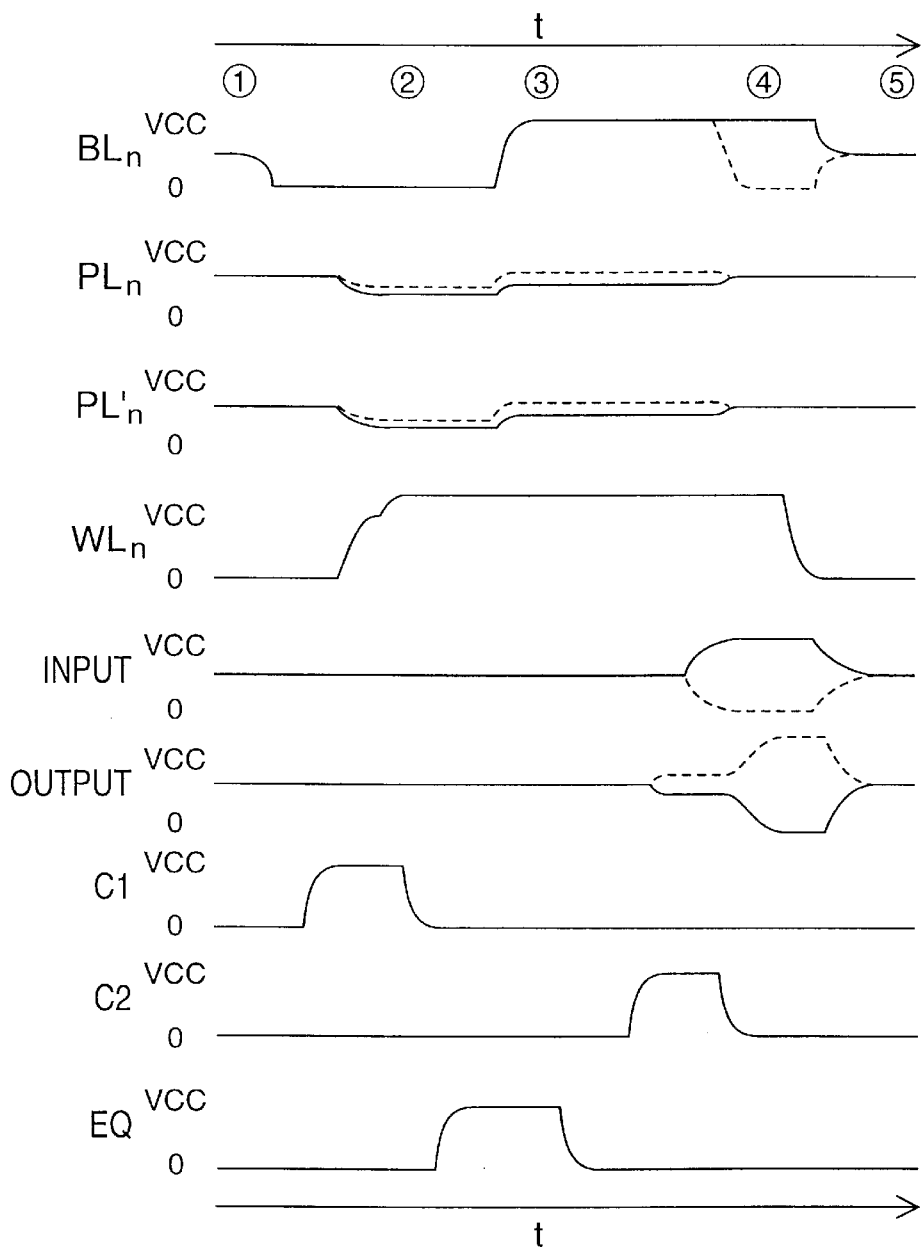
FIG. 3 shows the preferred embodiment of a timing diagram for the memory of FIG. 1.

The bit line driver 104 is, preferably, an on-chip circuit that drives the bit line, i.e., provides the voltage shown as BL$_n$ in FIG. 3 to the bit line 130 when column 160 is selected, and provides an identical voltage to the other bit lines when their column is selected. The design of such a bit line driver is known in the art, and thus will not be discussed further herein.

As known in the art, a unity gain amplifier (UGA) is an analog circuit that, when enabled, drives an amplifier output to the same voltage as a voltage on an amplifier input. The enabling inputs of unity gain amplifier 106 are C1 and C2. A "truth table" relating the amplifier functions of the preferred embodiment of unity gain amplifier 106 to the input signals C1 and C2 is shown in Table A.

TABLE A

| Input Signal | Enabled Unity Gain Function |
| --- | --- |
| C1 is high | Mirror PL on PL' |
| C2 is high | Mirror PL'on Output 158 |

As indicated in Table A, when C1 is high, UGA 106 mirrors the voltage PL input on the plate line, on the complementary plate line. That is, it drives complementary plate line voltage PL$_n$' to the same voltage as plate line PL. In terms of the nth column 160 of FIG. 1, UGA drives plate line 131 to the same voltage as plate line 130 when column 160 is selected and C1 is high. When C1 is not high, the function is disabled. When C2 is high, UGA 106 mirrors the voltage PL' on complementary plate line 131 on the output 158. In terms of the nth column 160, UGA 106 drives output 158 to the same voltage, PL$_n$', as the voltage on the complementary plate line 131 when column 160 is selected and C2 is high. When C2 is not high, the function is disabled.

Figure 2:
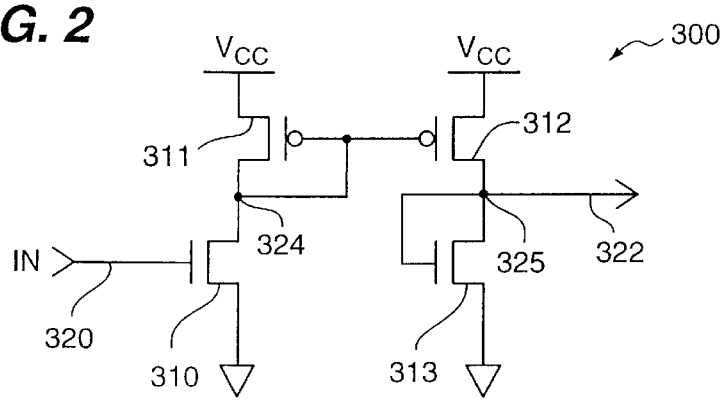
FIG. 2 shows a circuit diagram of the preferred embodiment of the unity gain amplifier circuit of FIG. 1.

Unity gain amplifiers are known in the art so the details of the circuitry of UGA 106 will not be discussed in detail. However, a typical unity gain amplifier 300 is shown in FIG. 2. It includes transistors 310, 311, 312, and 313 and an input 320 and an output 322. One source/drain of transistor 310 is connected to one source/drain of transistor 311. The other source/drain of transistor 310 is grounded, and the other source/drain of transistor 311 is connected to Vcc. One source/drain of transistor 312 is connected to one source/drain of transistor 313. The other source/drain of transistor 312 is connected to Vcc, and the other source/drain of transistor 313 is connected to ground. The node 324 between transistors 310 and 311 is connected to the gate of transistors 311 and 312 through an inverter, and the node 325 between transistors 312 and 313 is connected to the gate of transistor 313. The node 325 is also connected to the UGA output 322. One skilled in the art will recognize that the analog voltage on input 320 will be "mirrored" on output 322. That is, the voltage on output 322 will be identical to that on output 320.

A typical unity gain amplifier 300 has been shown to illustrate the fact that such amplifiers are very simple, the one shown in FIG. 2 comprising only four transistors and two inverters. As known in the integrated circuit art, transistors and inverters take up relatively little space on an integrated circuit chip. For example, the entire UGA 130 will typically take up less space on an IC chip than a single capacitor. Thus, as compared to the prior art, the present invention leads to a more dense IC chip; that is, a larger number of memory cells can be implemented on a chip, the chip can be made smaller, or both. As known in the art, a high density IC is also generally faster than a low density IC.

Turning now to FIG. 3, the detailed operation of the memory portion 100 according to the invention will now be described. FIG. 3 shows a graph of voltage versus time for the various voltages applied to and developed in the circuit of FIG. 1 in a read/rewrite cycle, which is conventionally known as a timing diagram. As is conventional for a timing diagram, the information is presented in a qualitative form to illustrate the relative points in time of the various operations; and, thus, the values along the time scale are not given. Prior to the beginning of the cycle, both BL$_n$ and PL$_n$ are equal to one-half Vcc; that is, half the supply voltage. Thus, there is no external field across the ferroelectric capacitor 112. Both the input and output are at one-half Vcc. C1, C2 and EQ are at zero volts, which holds the functions they control in the off state. PL$_n$', the complementary plate line signal to PL$_n$, is also at one-half Vcc. The cycle begins with the bit line 130 being driven to zero volts by bit line driver 104, and shortly thereafter C1 goes high. After these voltages have stabilized, WL$_n$, the word line 132 voltage, goes to Vcc, and then is boosted to about 1.5 Vcc. This turns on transistor 114 and passes the bit line voltage to the electrode 120 of capacitor 112. Boosting of word lines is known in the art. Boosting of the word line permits essentially the full voltage on bit line 130 to be applied to electrode 120. When the voltage on electrode 120 falls to zero volts, the plate line is still at one-half Vcc, so a voltage Vf is applied across capacitor 112. Put in terms of electric field, a first eletric field in the direction of the arrow 170b is applied across the ferroelectric material in capacitor 112 to read the capacitor. This develops a first charge and voltage PL$_n$ on plate line 132. We shall refer to this as the "read charge" or "read voltage" since this is the charge developed when the capacitor is read. If the capacitor was polarized in a direction opposite to the electric field applied across capacitor 112, then the applied field across capacitor 112 causes the ferroelectric material to switch and the voltage PL$_n$ developed is roughly proportional to the sum of the linear and switching charge of the capacitor 112 and follows the solid line in FIG. 3. If the capacitor was polarized in the same direction as the electric field applied across capacitor 112, then the ferroelectric material does not switch and the voltage PL$_n$ developed on plate line 132 is roughly proportional to the linear charge developed on the capacitor 112, and thus is less than the voltage in the case where the capacitor switched, and follows the dotted line in FIG. 3. Both these voltages are less than one-half Vcc, as will be discussed more fully below. Since C1 is high, the voltage PL$_n$' on complementary plate line 131 follows the voltage PL$_n$ on plate line 132. When the voltages on the plate and complementary plate line have stabilized, C1 goes low and EQ goes high. In this mode, complementary plate line 131 acts as an extension of plate line 132. In particular, the combined plate lines will have twice the plate line capacitance, C$_{PL}$.

When the transistor 156 is fully on, bit line 130 is driven to Vcc. Since the plate line is at a voltage below one-half Vcc, this causes a second electric field in the direction of the arrow 170a; that is, an electric field opposite to the direction of the first electric field, to be placed across capacitor 112. This causes the ferroelectric capacitor to switch. It is important to note that when the second electric field is placed across the capacitor 112, the capacitor always switches, since first electric field has placed it in the opposite polarity to that created by the second field. The second field creates voltage, the absolute value of which we shall refer to as the reference voltage signal, Vref, and a corresponding reference charge that is proportional to the sum of the linear and switching charges. This developed voltage signal is of the opposite sign to the read voltage, and thus, if we consider both the read voltage and the reference voltage to be positive, i.e the absolute values of the respective voltages developed, the net effect of the operation is that the read voltage is subtracted from the reference voltage to create a net voltage on the plate line voltage PLn. In the case where the capacitor did not switch when $BL_n$ went low, i.e. the dotted $BL_n$ line in FIG. 3, the voltage on the plate line will rise to a value higher than one-half Vcc, since the reference voltage developed is proportional to the sum of the linear and switching charges. Note that the fact that the capacitance of plate line 131 is added to the capacitance of plate line 130 tends to decrease the reference voltage, but this decrease is not as much as the increase due to the greater switching charge. In the case where the capacitor switched, i.e., the solid line $BL_n$ in FIG. 3, the reference voltage developed by the second field will be less than the read voltage developed by the first field, since now the capacitance of plate line 131 is added to the capacitance of plate line 130. Thus, plate lines 130 and 131 will go to a voltage less than one-half Vcc. EQ then goes low, causing transistor 156 to turn off, and isolating the complementary plate line 131 from the plate line 130. C2 then goes high, and output 158 is driven to the voltage on $PL_n{'}$ by unity gain amplifier 106. Sense amplifier 108 is turned on shortly thereafter, and shortly after the sense amplifier turns on, C2 goes low. Since the sense amplifier is connected across the input and output, and since the input is at one-half Vcc, then, if $PL_n{'}$, and thus the output, is higher than one-half Vcc, then the sense amplifier drives the output to Vcc and the input to zero; i.e., the input and output follow the dotted lines in FIG. 3. On the other hand, if $PL_n{'}$, and thus the output, is lower than one-half Vcc, then the sense amplifier drives the output to zero and the input to Vcc; i.e., the input 157 and output 158 follow the solid lines in FIG. 3. This provides the data signal on the output line. Those skilled in the art can see that a data signal can be taken off the input line also, if desired, though this would be of the opposite logic state. Also, those skilled in the art will recognize that one can also use the developed voltage on the plate line or complementary plate line directly also as the voltage to compare. The bit line driver 104 drives the bit line to the same voltage as the input. The word line then goes low to turn off transistor 114 and the bit and plate lines are driven to one-half Vcc, thereby returning all the lines to their original voltages and ending the cycle.

Figure 4:
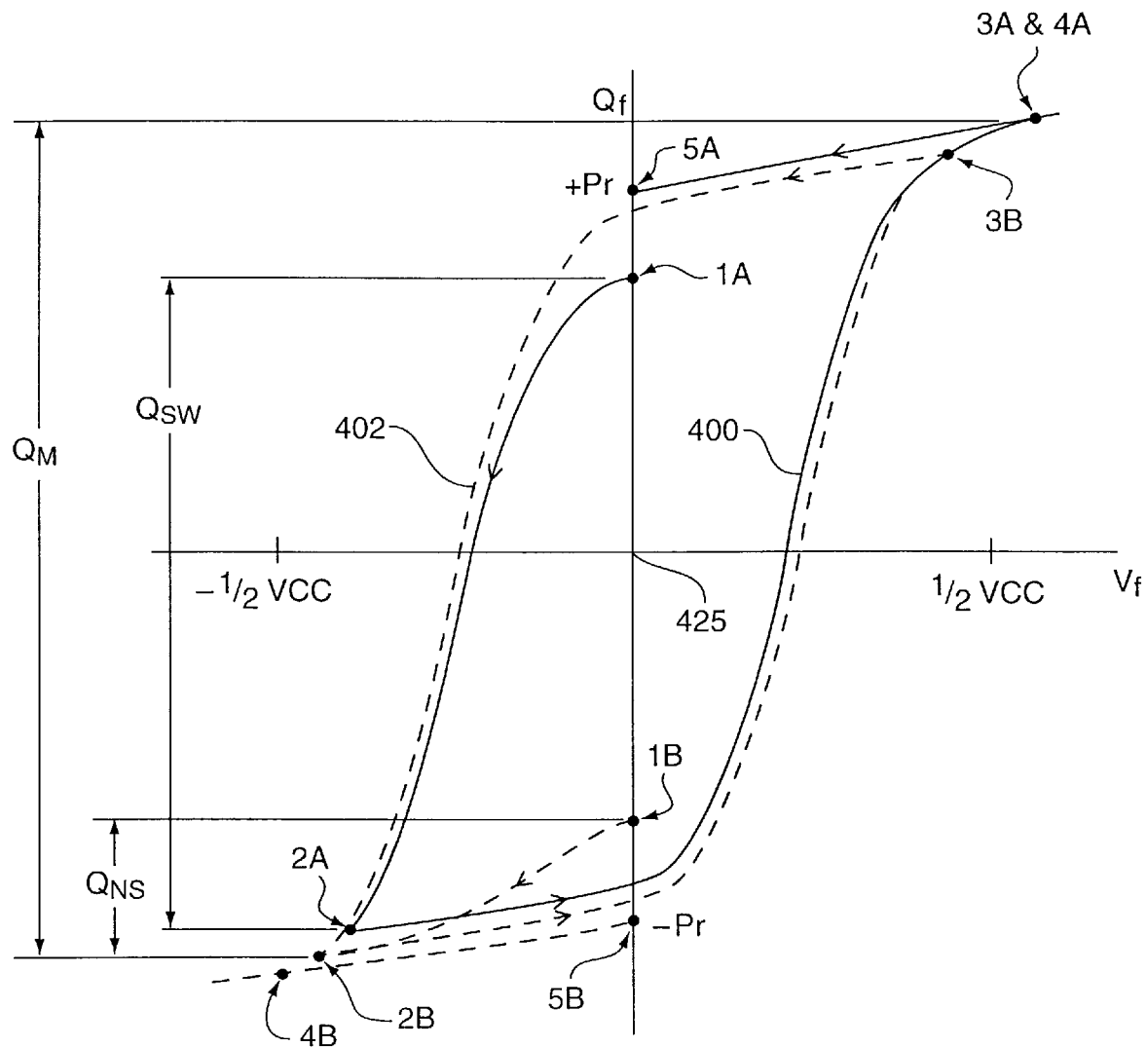
FIG. 4 shows an exemplary hysteresis diagram for a typical ferroelectric capacitor utilized in the memory of FIG. 1 which illustrates the state of the ferroelectric capacitor at various times in the timing diagram of FIG. 3.

We now turn to FIG. 4 and a discussion of the voltages applied and developed across the ferroelectric capacitor 112 and the charges created by those voltages. The solid hysteresis curve 400 is the hysteresis curve for a ferroelectric capacitor 112 which originally is polarized in the direction of the arrow 170a in FIG. 1, while the dashed curve 402 is the hysteresis curve for a ferroelectric capacitor 112 which originally is polarized in the direction of the arrow 170b in FIG. 1. As indicated above, the points for a capacitor originally in the state polarized in the direction of the arrow 170a are labeled with an "a" in FIGS. 3 and 4, while the points for a capacitor originally in the state polarized in the direction of the arrow 170b are labeled with a "b". In FIG. 4, points 1a and 1b indicate the starting points for the capacitor polarized in the direction 170a and for the capacitor polarized in the direction of the arrow 170b, respectively, and correspond to the position along the time axis at the point 1 in FIG. 3. Again, as conventional in the art for such hysteresis curves, the number scale is not given since the curve is intended to represent only a qualitative representation of the various points on the qualitative curves of FIG. 3. The x-axis is a voltage scale with units in volts and y-axis is a polarization scale with the units in microcoulombs per centimeter squared ($\mu$coulombs/cm$^2$). As can be seen from FIGS. 1 and 4, a polarization in the direction of the arrow 170a is taken to be a positive polarization, and when the electrode 120 on the bit line side of the capacitor has the higher voltage, Vf is taken to be positive. At point 1a, there is no external applied voltage on the capacitor 112, i.e. Vf is zero, and the capacitor has a positive polarization charge. Note that the polarization is not as high as the polarization reached later in the cycle, because it is assumed that at least a few milliseconds has elapsed since the polarization state was entered, and in such a case the ferroelectric will have relaxed to the lower polarization state. The memory operation does not require that the initial state be a relaxed one; the self-referencing feature enables a true reading to take place from any initial state; it simply is selected as the initial state because it is most likely that is the case.

The initial voltage applied to the capacitor in the "a" state is a negative voltage, which causes the capacitor to switch and go to the state 2a. The switching charge is Qsw. There will also be a linear charge developed on the capacitor, Qla, so the total charge developed will be Qla-Qsw (Qla is negative so this is a negative charge). Qla is very nearly one-half $VccC_{PL}$, where $C_{PL}$ is the plate line capacitance. This is not exactly true; that is, the linear displacement charge will actually be slightly smaller than this due to the shift in voltage of the plate line, but is true enougn for the qualitative discussion that follows. That is, this discussion is not intended to be exact quantitatively, but rather is intended to give a qualitative understanding of the principles on which the invention operates. While the capacitor is in the 2a state, the voltage PL is mirrored on complementary plate line 13, then the two plate lines are connected via transistor 156. Since the complementary plate line has the same capacitance, $C_{PL}$, as the plate line 130, the combination of the two plate lines has the charge $C_{PL}$Vcc-2Qsw on a capacitance of $2C_{PL}$. After $BL_n$ is driven high, the capacitor in the state "a" goes to the point 3a, at which point a charge Qm is added to the charge on the two plate lines. As a result, the charge $Q_{PL/PL'}$ on the two plate lines is:

$$Q_{PL/PL'} = C_{PL} \text{Vcc} - 2\text{Qsw} + \text{Qm}. \tag{1}$$

The voltage $PL_n{'}$ on the two plate lines is:

$$PL_n{'} = Q_{PL/PL'}/(2C_{PL}) = \frac{1}{2}\text{Vcc} + (-\text{Qsw} + \frac{1}{2}\text{Qm})/C_{PL}. \tag{2}$$

Since Qm≈Qsw+Qns, then:

$$PL_n{'} = \frac{1}{2}\text{Vcc} + \frac{1}{2}(\text{Qns} - \text{Qsw})/C_{PL}. \tag{3}$$

And since Qsw>Qns, then $PL_n{'}<\frac{1}{2}$ Vcc. This is true even if the first term, one-half Vcc, is not quite correct. Thus, when $PL_n{'}$ is compared to ½ Vcc with a differential amplifier, i.e. sense amplifier 108, a low or "data 0" output is produced.

To consider the capacitor in the state "b", we repeat the above analysis, replacing Qsw in the equation (1) with Qns. Equation (3) then becomes:

$$PL_n{'} = \frac{1}{2}\text{Vcc} + \frac{1}{2}(\text{Qsw} - \text{Qns})/C_{PL}. \tag{4}$$

Since Qsw>Qns, then $PL_n{'}>\frac{1}{2}$ Vcc, which is true providing the difference between Qsw and Qns is greater than the difference between the true value of the voltage applied across capacitor 112 and one-half Vcc. For a material with a hysteresis curve as in FIG. 4, this is very true, and those skilled in the art will recognize that this is easily true for current ferroelectric memory materials, such as layered superlattice materials, under any condition encountered by a practical memory. See, forexample, U.S. Pat. No. 5,519,234 issued May 21, 1996. Thus, when $PL_n{'}$ is compared to one-half Vcc by the sense amplifier, a high or "data 1" output is produced.

If the "data 1" state is sensed, the capacitor remains in the same state after the rewrite portion of the cycle, as shown by the number 4a in FIG. 4, and if the "data 0" state is sensed, the capacitor is driven to the 4b state. When the bit and plate lines return to one-half Vcc, the capacitor in the "data 1" state returns to the point 5a, while the capacitor in the "data 0" state returns to the state 5b. After a few milliseconds, the ferroelectric material will relax back to the starting states, 1a and 1b, respectively.

The operation of the invention can also be understood by examining the hysteresis curves of FIG. 4. It can be seen that for either initial state, the second pulse completely switches the ferroelectric capacitor, from one state to the opposite state, taking the polarization and voltage from one corner to the other of the hysteresis curve. Put another way, it is seen that the first pulse "cocks" the ferroelectric material, so that the second pulse always fully switches the ferroelectric material. This is done while the capacitance of the plate line is essentially doubled. Thus, the voltage developed on the plate line, and complementary plate line, is essentially the voltage that would be developed going from the zero point of the graph out to maximum polarization; i.e. one-half of the maximum voltage that can be developed from a full switch. From that, a voltage is subtracted that in one case is the voltage developed due to the switching charge, and in the other case is equal to the voltage developed due to the non-switching charge. Since in any ferroelectric material in any condition the non-switched value is less than the zero point to maximum voltage, and the switched value is more, the former will give a result greater than "zero" and the latter will give a result less than "zero". Since the "zero" or starting point is one-half Vcc, it must result that the voltage value resulting from the non-switched state will be greater than one-half Vcc and resulting from the switched state will be less. Thus, as can be appreciated by one skilled in the art, the driving scheme according to the invention results in a capacitor in the "a" state developing a voltage on the complementary line that is always less than one-half Vcc, and a capacitor in the "b" state always developing a voltage on the complementary line that is greater than one-half Vcc, no matter what the prior history of the capacitor. In this manner, the memory acts as its own reference.

A feature of the invention is that the capacitor 112 is rapidly pulsed twice in succession during a single cycle. Since the second pulse takes place very quickly after the first pulse, there is no time for the ferroelectric to relax or some other change to take place. This is a another factor that permits the capacitor to act as its own reference The invention also contemplates that the plate line can be driven and the data signal is developed on the bit line. In this embodiment, the plate line is connected to a plate line driver, the bit line is connected to a UGA, and an equalization transistor connects the bit line with a complementary bit line. The timing is the same as that of FIG. 3 except the plate line is driven in the same manner as the bit line of FIG. 3, a signal similar to the signal PLn is developed on the bit line, and a signal BLn' is developed on the complementary bit line, which signal is mirrored on the output. This embodiment has the advantage that the word line does not have to be boosted.

Figure 5:
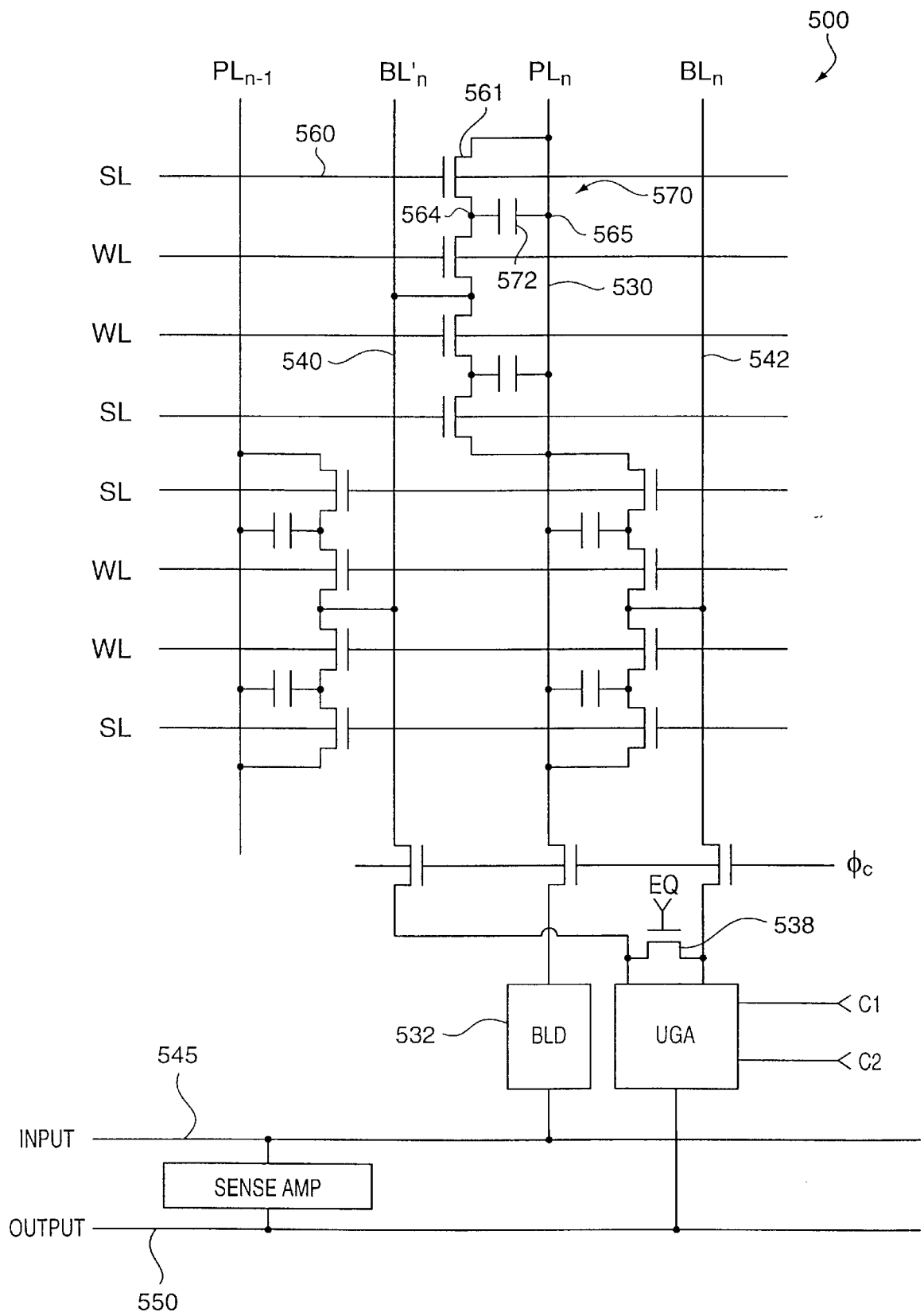
FIG. 5 shows an alternative memory array according to the invention having a folded bit/plate architecture and a driven plate line.

The above discussion was in terms of an open architecture. As known in the art, an open architecture is one in which the sense amp and related operating circuitry lies between two essentially identical arrays, one of which is complementary to the other. The invention can also be used with a folded bit/plate architecture, and in some cases this is preferred, since, as known in the art, the folded architecture results in lower noise. As known in the art, in a folded architecture, the complementary lines lie on the same side of the sense amp and related circuitry, and thus the complementary lines can share the same word and shunt lines as a non-complementary portion of the array. An array 500 incorporating the preferred folded bit/plate architecture is shown in FIG. 5. In this architecture, the plate line 530 is driven by plate line driver 532 which responds to signals on input 545. In this embodiment, the plate line 530 is shared between the complementary bit line 540 and the bit line 542. A unity gain amp is responsive to the C1 and C2 signals to drive the complementary bit line 540 and the output 550. An equalization transistor 538 connects the bit line 542 and the complementary bit line 540 in response to the EQ signal. Alternatively, the bit line can be driven and the signal developed on the plate line. In addition, FIG. 5 includes shunt lines, such as 560 and shunt transistors, such as 561. Shunt line 560 in combination with shunt transistor 561 equalizes the voltages between nodes 564 and 565 when cell 570 is not addressed, to make sure that the cell is not disturbed; that is, to ensure that the voltage across the capacitor 572 is essentially zero, except when the cell 570 is addressed. A complete disclosure of the design and function of a shunt system is found in U.S. patent application Ser. No. 08/931,023 filed Sep. 15, 1997, which patent application is hereby incorporated by reference as though fully disclosed herein.

As can be seen by the architectures discussed above, the memory according to the invention uses very dense arrays. That is, the density is essentially the same as state-of-the-art folded arrays.

FIG. 6 is a block diagram illustrating an exemplary integrated circuit memory 436 in which memory portion 100 is a part, and in which memory arrays, such as 102, 500 and 600, according to the invention are utilized. For simplicity, the embodiment shown is for a 16K×1 FeRAM; however, the material may be utilized in a wide variety of sizes and types of memories, including, but not limited to, those in which the addresses are not multiplexed, such as flash or SRAM type memories. In the 16K embodiment shown, there are seven address input lines 438 which connect to a row address register 439 and a column address register 440. The row address register439 is connected to row decoder441 via seven lines 442, and the column address register 440 is connected to a column decoder/data input output multiplexer 443 via seven lines 444. The row decoder 441 is connected to a 128×128 memory cell array 445 via 128 lines 446, and the column decoder/data input /output multiplexer 443 is connected to the sense amplifiers 479 and memory cell array 445 via 128 lines 447. A signal generator 480 is connected to the array 445 via lines 484. These lines provide the C1, C2, EQ, and $\Phi_c$ signals as well as the signals to the plate line 130 and the signals on lines 180 to the bit line driver 104 discussed above. The number of lines depends on which embodiment of the invention discussed above is utilized, as well as the size of the array. An RAS* signal line 448 is connected to the row address register 439, row decoder 441, column decoder/data input/output multiplexer443, and signal generator 480, while a CAS* signal line 449 is connected to the column address register 440, column decoder/data input/output multiplexer 443, and signal generator 480. (In the discussion herein, a indicates the inverse of a signal.) An input/output data line 435 is connected to the column decoder/data input/output multiplexer443. Memory cell array 445 contains 128×128=16,384 memory cells, which is conventionally designated as 16K. These cells are ferroelectric switching capacitor-based cells such as 110. The lines 446 are the word lines, such as 136. The lines 447 are the input and output lines, such as 157 and 158.

The operation of the memory in FIG. 6 is as follows. Row address signals $A_0$ through $A_6$ and column address signals $A_7$ through $A_{13}$ placed on lines 438 are multiplexed by address registers 439 and 440 utilizing the RAS* and CAS* signals, and passed to the row decoder 441 and column decoder/data input/output multiplexer 443, respectively. The row decoder 441 places the word line signals, such as the WLn signals discussed above on one of the word lines 446; generally a signal is placed on the word line of the cell that is addressed. The column decoder/data input/output multiplexer 443 either places the data signal which is input on line 435 on one of the input lines 447 corresponding to the column address, or outputs on the data line 435 the signal on one of the output lines 447 corresponding to the column address, depending on whether the function is a write or read function. As is known in the art, the read function is triggered when the RAS signal precedes the CAS* signal, and the write function is triggered when the CAS* signal comes before the RAS signal. The sense amplifiers 479, one of which is sense amplifier 108, are located along lines 447 to amplify the signals on the lines. The plate line signals, such the PLn signals discussed above, and the shunt line signals when a shunt system is used, are produced by signal generator 480 based on the CAS* and RAS* signals and an internal chip clock. In some memories, the signal generator 480 and row decoder 441 may be combined into a single signal generation unit. The circuitry of the row decoder 441, column decoder 443, and signal generator 480 is known in the art of integrated circuit memory design, and will not be further discussed herein. Other logic required or useful to carry out the functions outlined above as well as other known memory functions is also included in the memory 436 but is not shown or discussed, as it is not directly applicable to the invention.

A feature of the invention is that the length of a cycle is essentially the same as the cycles of state-of-the-art DRAMS. The cycle length is extended a little by the need for the C1 and EQ signals to develop while the plate line signal is developed, and the need for a second pulse in the opposite direction to the first pulse, but these are minor increases in timing as compared to prior art ferroelectric memories in which signals had to develop on three different capacitors at different times, with corresponding timing needs for each capacitor. Moreover, since in state-of-the-art memories a rewrite cycle usually takes place at the end of the read cycle, and in the memory according to the invention this rewrite is combined with the second pulse, the cycle time for the memory according to the invention is close to the cycle time for state-of-the-art memories. Further, extensions in cycle length roughly of the length of the extensions mentioned above are common in state-of-the-art memories to provide time for one or another enhancements that contribute to memory reliability. Thus, the invention provides a self-referenced ferroelectric memory that has similar performance to a state-of-the-art DRAM.

There has been described a novel ferroelectric memory that is insensitive to changes in the ferroelectric state over time, and at the same time is fast and dense. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, now that the advantage of developing a charge on the plate (or bit) line that is essentially equal to one-half the polarization charge when the ferroelectric capacitor is switched from one state to the other, and then subtracting the charge developed when the capacitor was read has been disclosed, other methods and apparatus for doing the same can be substituted. It is evident that this can be done without a unity gain amplifier and without the equalization transistor, say by substituting a special capacitance that is equal to $C_{PL}$ into the memory. It is also evident that the bit line (or plate line if the plate line is driven) can be first raised to Vcc and then lowered to zero volts, with essentially the same result, except that the "data 1" and "data 0" states will be reversed. It is also evident that the signals discussed may in some instances occur in a different order; or equivalent structures and process may be substituted for the various structures and processes described; or a variety of different circuits and ferroelectric materials may be used. For example, while the invention has been explained in terms of subtracting the read voltage from the reference voltage, it could also be explained in terms of subtracting the reference voltage from the read voltage. Consequently, the invention is to be construed as embracing each and every novel feature and novel combination of features present in and/or possessed by the ferroelectric memory and read and write processes described.

We claim:

1. A ferroelectric integrated circuit memory comprising:
   a memory cell comprising a ferroelectric memory element;
   a first conducting line electrically connected to or electrically connectable to said ferroelectric memory element;
   a second conducting line connected to or electrically connectable to said ferroelectric memory element;
   a third conducting line;
   a line driver for driving said first conducting line to place a first field across said ferroelectric element and a second field across said ferroelectric memory element, said first and second electric fields being in opposite directions;
   a unity gain amplifier for driving said third conducting line to the same voltage as said second conducting line;
   a switch for connecting said second conducting line and said third conducting line; and
   a signal generator for generating timing signals and applying the timing signals to said line driver, said unity gain amplifier and said switch.

2. A ferroelectric integrated circuit memory as in claim 1 wherein said ferroelectric element is a ferroelectric capacitor.

3. A ferroelectric integrated circuit memory as in claim 2 wherein said memory includes a bit line, a first plate line connected to one electrode of said capacitor, and a transistor between said bit line and the other electrode of said capacitor, said first conducting line comprises said bit line, and said second conducting line comprises said plate line.

4. A ferroelectric integrated circuit memory as in claim 3 wherein said third conducting line comprises a second plate line complementary to said first plate line.

5. A ferroelectric integrated circuit memory as in claim 2 wherein said memory includes a first bit line, a plate line connected to one electrode of said capacitor, and a transistor between said bit line and the other electrode of said capacitor, said first conducting line comprises said plate line, and said second conducting line comprises said first bit line.

6. A ferrnelectric integrated circuit memory as in claim 5 wherein said third conducting line comprises a second bit line complementary to said first bit line.

7. A ferroelectric integrated circuit memory as in claim 1 wherein said memory has a folded architecture.

8. A ferroelectric integrated circuit memory as in claim 1 wherein said memory has an open architecture.

9. A method of reading a ferroelectric integrated circuit memory that includes a ferroelectric element, a first conducting line electrically connected or connectable to said ferroelectric element, and a second conducting line electrically connected or connectable to said ferroelectric element, and a third conducting line, said method comprising the steps of:

applying a first voltage to said first conducting line to develop a first corresponding voltage on said second conducting line;

driving said third conducting line to a voltage essentially equal to said first corresponding voltage;

connecting said second conducting line to said third conducting line;

applying a second voltage to said first conducting line to develop a second corresponding voltage on said second conducting line and said third conducting line; and sensing said second corresponding voltage to provide an output signal representative of the state of said ferroelectric element prior to said step of applying a first voltage.

10. A method as in claim 9 wherein said memory has a power supply for providing a supply voltage, one of said first voltage and said second voltage is less than one-half said supply voltage and the other of said first voltage and said second voltage is greater than said supply voltage.

11. A method as in claim 9 wherein said ferroelectric element is a capacitor, said step of applying a first voltage creates a first electric field across said capacitor, and said step of applying a second voltage creates a second electric field across said capacitor, said second electric field opposite in direction to said first electric field.

12. A method of reading a ferroelectric integrated circuit memory, said memory including a ferroelectric element and said method comprising the steps of:

applying a first electric field across said ferroelectric element to develop a first charge on a conducting line;

applying a second electric field across said ferroelectric element to develop a second charge on said conducting line, said second electric field essentially equal to and opposite in direction to said first electric field;

permitting a voltage to develop on said conducting line as a result of said first and second charges; and sensing said voltage with a sense amp to produce an output voltage indicative of the polarization state of said ferroelectric element prior to placing said first and second fields across said ferroelectric element.

13. A method as in claim 12 wherein: said first charge comprises either: the switching charge developed when said ferroelectric element switches in response to said first electric field applied across said ferroelectric element, or the non-switching charge developed when said first electric field is placed across said ferroelectric element and said ferroelectric element does not switch; and said second charge equal to essentially one-half the charge developed when said ferroelectric element switches from full polarization in one direction to full polarization in the opposite direction in response to said second electric field.

14. A method as in claim 12 wherein said memory includes a third conducting line and said step of developing said second charge includes the step of connecting said first conducting line to said third conducting line.

15. A method as in claim 12 wherein said memory includes a third conducting line and said step of developing said second charge includes the step of developing a charge on said third conducting line that is essentially equal to said first charge.

16. A method of reading a ferroelectric integrated circuit memory, said memory including a ferroelectric element capable of being in a first polarization state and a second polarization state, a conducting line electrically connected or connectable to said ferroelectric element, said method comprising the steps of:

developing a voltage on said conducting line by applying a first electric field and a second electric field to said ferroelectric element, said second electric field in a direction opposite to said first electric field; and sensing said developed voltage with a sense amplifier to produce an output voltage indicative of the state of said ferroeletric element prior to placing said first and second fields across said ferroelectric element.

17. A method as in claim 16 wherein said step of developing comprises changing the capacitance of said conducting line between the application of said first electric field and the application of said second electric field.

18. A method as in claim 16 wherein said ferroelectric element is a capacitor, said memory includes a bit line and a plate line, and said conducting line comprises said plate line.

19. A method as in claim 16 wherein said ferroelectric element is a capacitor, said memory includes a bit line and a plate line, and said conducting line comprises said bit line.

* * * * *